US006285070B1

(12) United States Patent
Corisis et al.

(10) Patent No.: US 6,285,070 B1
(45) Date of Patent: Sep. 4, 2001

(54) METHOD OF FORMING SEMICONDUCTOR DIE WITH INTEGRAL DECOUPLING CAPACITOR

(75) Inventors: David J. Corisis, Meridian; Jerry M. Brooks, Caldwell, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/298,159

(22) Filed: Apr. 23, 1999

Related U.S. Application Data

(60) Continuation of application No. 08/854,906, filed on May 13, 1997, now abandoned, which is a division of application No. 08/577,186, filed on Dec. 22, 1995, now abandoned, which is a division of application No. 08/962,143, filed on Oct. 31, 1997, now abandoned.

(51) Int. Cl.[7] ................................................ H01L 29/00
(52) U.S. Cl. ...................... 257/532; 257/277; 257/528; 257/531; 257/533
(58) Field of Search .................................... 257/275, 277, 257/728, 307, 515, 528, 531, 532, 535, 924

(56) References Cited

U.S. PATENT DOCUMENTS

| | | | |
|---|---|---|---|
| 4,055,444 | 10/1977 | Rao | 438/250 |
| 4,355,454 | 10/1982 | Tasch, Jr. et al. | 438/586 |
| 4,410,905 | 10/1983 | Grabbe | 257/668 |
| 4,535,530 | 8/1985 | Denda et al. | 438/250 |
| 4,989,117 | 1/1991 | Hernandez | 361/306.2 |
| 5,095,402 | 3/1992 | Hernandez et al. | 361/306.2 |
| 5,103,283 | 4/1992 | Hite | 257/724 |
| 5,111,169 * | 5/1992 | Ikeda | 333/181 |
| 5,128,729 | 7/1992 | Alonas et al. | 257/433 |
| 5,140,496 | 8/1992 | Heinks et al. | 361/306.2 |
| 5,212,402 | 5/1993 | Higgins, III | 257/394 |
| 5,258,648 * | 11/1993 | Lin | 257/778 |
| 5,304,506 | 4/1994 | Porter et al. | 438/394 |
| 5,307,309 | 4/1994 | Protigal et al. | 365/63 |
| 5,369,545 | 11/1994 | Bhattacharyya et al. | 361/306.2 |
| 5,416,356 * | 5/1995 | Staudinger et al. | 257/531 |
| 5,457,063 | 10/1995 | Park | 438/396 |
| 5,457,065 | 10/1995 | Huang et al. | 438/397 |
| 5,459,094 | 10/1995 | Jun | 438/254 |
| 5,459,095 | 10/1995 | Huang et al. | 438/396 |
| 5,461,536 | 10/1995 | Beach et al. | 361/328 |
| 5,462,877 | 10/1995 | Gluck | 438/158 |
| 5,492,856 * | 2/1996 | Ikeda et al. | 438/381 |
| 5,541,442 | 7/1996 | Keil et al. | 257/533 |
| 5,563,762 | 10/1996 | Leung et al. | 361/301.4 |
| 5,668,399 | 9/1997 | Cronin et al. | 257/532 |
| 5,701,647 | 12/1997 | Saenger et al. | 438/396 |
| 5,825,092 * | 10/1998 | Delgado et al. | 257/778 |
| 5,914,508 * | 6/1999 | Varmazis et al. | 257/275 |

FOREIGN PATENT DOCUMENTS

| | | |
|---|---|---|
| 61-263251A | 11/1986 | (JP) . |
| 4-127161A | 4/1992 | (JP) . |

OTHER PUBLICATIONS

IBM Technical Disclosure Bulletin, "Decoupling Capacitor Incorporated in Printed Circuit Board," vol. 33, No. 10A, p. 424, Mar. 1991.

"On–Chip Decoupling Capacitors for VLSI Gate Array and Master Image Products," IBM Technical Disclosure Bulletin, vol. 31, No. 8, Jan. 1989. p381.

* cited by examiner

Primary Examiner—Stephen D. Meier
Assistant Examiner—Jeff Vockrodt
(74) Attorney, Agent, or Firm—TraskBritt

(57) ABSTRACT

A gateway or circuit barrier capacitor incorporated in a semiconductor die structure in lieu of a discrete capacitor employed with such a die in a Chip on Board assembly such as a single in-line memory module (SIMM). The capacitor may comprise a single layer with laterally adjacent, dielectrically-separated electrode traces, or a more traditional vertically-superimposed electrode design with an intervening dielectric layer. The capacitor is preferably formed using the existing fabrication process for the die by altering a photoresist mask to define the electrode traces in the same step as other conductors, such as bond pads, are formed.

19 Claims, 4 Drawing Sheets

METHOD OF FORMING SEMICONDUCTOR DIE WITH INTEGRAL DECOUPLING CAPACITOR

CROSS REFERENCE TO RELATED APPLICATION

This application is a continuation of application Ser. No. 08/854,906, filed May 13, 1997, now abandoned, which is a divisional of application Ser. No. 08/577,186, filed Dec. 22, 1995, abandoned, and is also related to application Ser. No. 08/962,143, filed Oct. 31, 1997, abandoned.

BACKGROUND OF THE INVENTION

1. Field of the Invention

This invention relates to semiconductor dies, also commonly referred to as "chips." It is particularly directed to the fabrication of a capacitor on a semiconductor die, the term dice including not only singulated dies but also partial wafers and entire wafers from which dies may be separated.

2. State of the Art

Circuit boards and other carrier substrates or platforms, both single- and multi-level, are employed to mechanically support and electrically connect both active devices, such as semiconductor dies, as well as passive components, such as resistors, capacitors and inductors. Conventional chip on board (C.O.B.) assemblies typically include discrete components of both classes, e.g., resistors, capacitors, and inductors, as well as various solid state "chips" or "dies" hard wired, plugged, soldered, ball-bonded or otherwise electrically connected to a conductor network carried by a platform such as a card, board or other substrate. In the prior art, discrete capacitors as well as resistors and inductors are often required to be placed on the platform in combination with adjacent, associated semiconductor dice, for example in the construction of a single in-line memory module (SIMM). With the increased circuit densities required by ever-faster processors and larger memories, due to a generally fixed board or platform area, commonly termed "real estate" in the semiconductor industry, the use of discrete passive components is viewed as an undesirable but hitherto necessary waste of real estate which could otherwise be applied to better and higher uses. The only exception to the requirement for a discrete capacitor known to the inventors is the fabrication of a capacitor on the board to which chips or dies may be attached.

It should be noted that the discrete capacitors referenced above are chip- or die-level capacitors serving as protective, noise-reducing gateways between the die and the remainder of the circuit in the assembly. Such capacitors are to be distinguished from the cell capacitors employed in dynamic random access memory (DRAM) cells, each cell of which includes a transistor (MOSFET) and capacitor. U.S. Pat. Nos. 5,547,063; 5,457,065; 5,459,094 and 5,459,095 illustrate various constructions which provide capacitance for dynamic random access memory (DRAM) cells. In each instance, the capacitor construction is integrated into the cell itself. As noted, such capacitors simply provide the storage requirement of the cell. U.S. Pat. No. 5,461,536 similarly discloses the construction of planar storage capacitors in association with the cells of a DRAM chip. The method disclosed involves a sequence of deposition and etching steps which add both electrode and dielectric layers to chips constructed from inorganic oxides.

Semiconductor chips or dice, are conventionally fabricated by a series of material deposition, removal and conversion steps to selectively add, remove and alter the state of silicon and various metals to form the end-product die. For example, materials may be deposited upon, removed from, or converted to a different structure on a region of a substrate, either to form conductive structures on that level (such as circuit traces or bond pads), to form insulative, dielectric or passivating structures, or to penetrate beneath and form inter-level conductive elements (such as contacts or vias) or active component segments (n- and p-doping by diffusion or ion implantation) of the semiconductor devices residing in the die. Stated simplistically from another perspective, a semiconductor die may be viewed as a stack of layers, any of which may function as a substrate for adjacent layers. Typically, layers containing active (transistors, diodes, memory cells) or passive (capacitors, resistors) electronic components are separated by dielectric layers to avoid electrical shorts.

There remains a need for a simple, low cost technique for incidentally constructing a capacitor on or within a die to replace the chip capacitor of a SIMM board or other assembly having a comparable need for a capacitive or other passive component in association with the die, and supplied in the prior art by a discrete structure connected to the same platform as the die.

SUMMARY OF THE INVENTION

According to the present invention, a capacitive element is fabricated directly as a layer, ideally the top conductive layer, of a semiconductor die, such as a dynamic random access memory (DRAM) chip. This construction approach avoids the necessity commonly confronted in C.O.B. technology for a capacitor chip (or equivalent discrete component) to be connected, as by solder paste or conductive epoxy, to the circuit board or other platform incorporating the die. Thus, each DRAM or other chip structure supported on a conductor platform, such as a circuit board, is provided with an integral die-level gateway capacitor as well as a resistor, if required, for special applications.

The die-level gateway capacitive element of the invention may be constructed through conventional mask (positive or negative resist) techniques in an additive or subtractive manner and in single or parallel planes. Ideally, the organic die coat which may be conventionally present on a finished die is relied upon to function as the dielectric component of the capacitor. Some die fabricators employ such a die coat in all instances, while others employ a die coat only with an LOC (leads over chips) configuration. The die coat composition may be selected specifically for its dielectric properties. Certain preferred embodiments include other components, such as a resistor, in the mask pattern. In this fashion, pre-designed capacitance and resistance values can be furnished in the die itself.

Preferably, the gateway capacitor is formed on the upper, front or active surface of a die. However, it is sometimes permissible or preferred to form the capacitor on the normally unused back surface of the die or incorporate it within one or more layers within the die itself.

Placing the gateway capacitor on the die eliminates the need for capacitor-to-die traces on the circuit board required with prior art discrete decoupling capacitors. Noise generated by the circuitry, as "seen" by a chip, is reduced to the lowest possible level by locating the capacitor as the final barrier between the circuit board and the chip. Chip performance is thereby optimized. Moreover, forming a capacitor in this fashion may require no additional steps when done in a die fabrication process already involving terminal or bond pad construction. All that is required is to utilize an appropriately modified mask for the fabrication process, unless a die coat not normally on the die must be added. The capacitor may be laid out and constructed incidental to the construction or rerouting of other conductive elements during the fabrication process on any convenient layer of the die having an adequate area to accommodate the capacitor traces and intervening dielectric. For example, rerouting peripheral bond pads into an array pattern for flip-chip applications presents a design opportunity to incorporate a capacitor according to the invention.

Positive and negative, generally planar, laterally-extending capacitor electrodes may be formed on the die surface or other layer in any convenient pattern effective to achieve a desired capacitance, typically less than about 500 pF, and usually within the approximate range of about 100–200 pF. One suitable such pattern positions the electrodes in a single-layer, side-by-side serpentine configuration with a narrow dielectric space or region laterally separating the electrodes. The capacitor of this invention can alternatively be formed in a more traditional configuration with two facing conductive layers separated by a thin dielectric layer. This configuration requires less real estate on the die, but is otherwise generally not preferred, because it may require additional steps in the fabrication process to deposit the intermediate dielectric layer, as well as a second conductive layer.

The capacitor may be positioned any place on or beneath the surface of a chip to accommodate the terminal pattern necessary for that particular chip. If placed on the top surface of the die, a passivating layer, such as polyimide, silicon nitride, silicon dioxide, BPSG, or a combination of any of the foregoing or other suitable materials known in the art, may be placed thereover for physical protection and electrical isolation. The invention thus has wide flexibility within its characteristic capacitance range. In any event, the electrodes are generally planar in the preferred embodiments. That is, the surface area of an electrode parallel the die layers is many times, typically orders of magnitude, greater than the surface area of the electrode edges as viewed generally perpendicular to the die layers.

It is contemplated that air, e.g. an unfilled space between laterally adjacent capacitor electrodes, may serve as the capacitor dielectric and the term "dielectric," as used herein, encompasses an inter-electrode air gap.

The capacitor will ordinarily include positive and negative bond pads, which may be located as required to facilitate bonding to a circuit board. These pads should be positioned at an edge of the chip in embodiments intended to be wire bonded to a circuit trace on a circuit board in order to employ the shortest possible bond wire lengths. Alternative constructions may position the bond pads remote from the perimeter of the die as convenient, e.g., for flip chip applications. The flip chip fabrication process may result in a matrix of relatively large bond pads (to accommodate the bump-type bonds employed) in the middle of the die. The configuration of the capacitor may then be adjusted appropriately, as by intertwining it around the various elements, e.g., pads, other terminals, or vias, on or extending through the layer or layers of the die upon which the capacitor is fabricated. In a flip-chip arrangement, for example, with a large centralized matrix or pattern of bond pads, the capacitor may extend peripherally on the die, extending around the bond pad matrix and electrically connecting to two of the bond pads by inwardly-extending conductors.

While a subtractive etching process employing either negative or positive photoresist to selectively remove a previously-deposited conductive layer is presently preferred to form the traces for the capacitor as well as integral conductors leading to bond pads at the distal ends, a deposition or additive process of depositing the capacitor electrode structure and associated conductors through a pre-placed mask could also be employed for this purpose. It is also generally preferred, as noted above, that an outer dielectric layer be applied over the capacitor traces on a die surface to prevent shorting and to protect them from physical damage.

Conventional die fabrication typically involves applying a preselected quantity of a die coat material, such as liquid polyimide or a polyimide precursor, on the top of a wafer. The wafer may then be spun to distribute the coating material evenly about the wafer's surface. The coating is then allowed to harden. According to this invention, after the coat is hardened, a conductive layer, such as aluminum, an aluminum alloy, copper, or tungsten, is placed over the die coat. The conductive layer may be etched after masking to form the capacitor traces and the terminals for the chips to be formed from the wafer in a single step. It is generally convenient to use the same material, typically aluminum or aluminum/copper alloy, for both the capacitor electrodes and the die bond pads. It is important to match the coefficient of thermal expansion of the capacitor materials to that of the rest of the die to avoid thermally-induced delamination as the chip heats and cools in operation. Thermal expansion considerations also influence the pattern selected for the capacitor electrodes. A serpentine pattern is often preferred from this standpoint. A die will ordinarily tend to expand from its center of mass, and expansion is minimized by providing a shorter trace in any given direction, as is inherently provided by a serpentine or comparable configuration.

BRIEF DESCRIPTION OF THE SEVERAL VIEWS OF THE DRAWINGS

In the drawings, which illustrate what is currently regarded as the best mode for carrying out the invention.

DETAILED DESCRIPTION OF THE INVENTION

Figure 1:
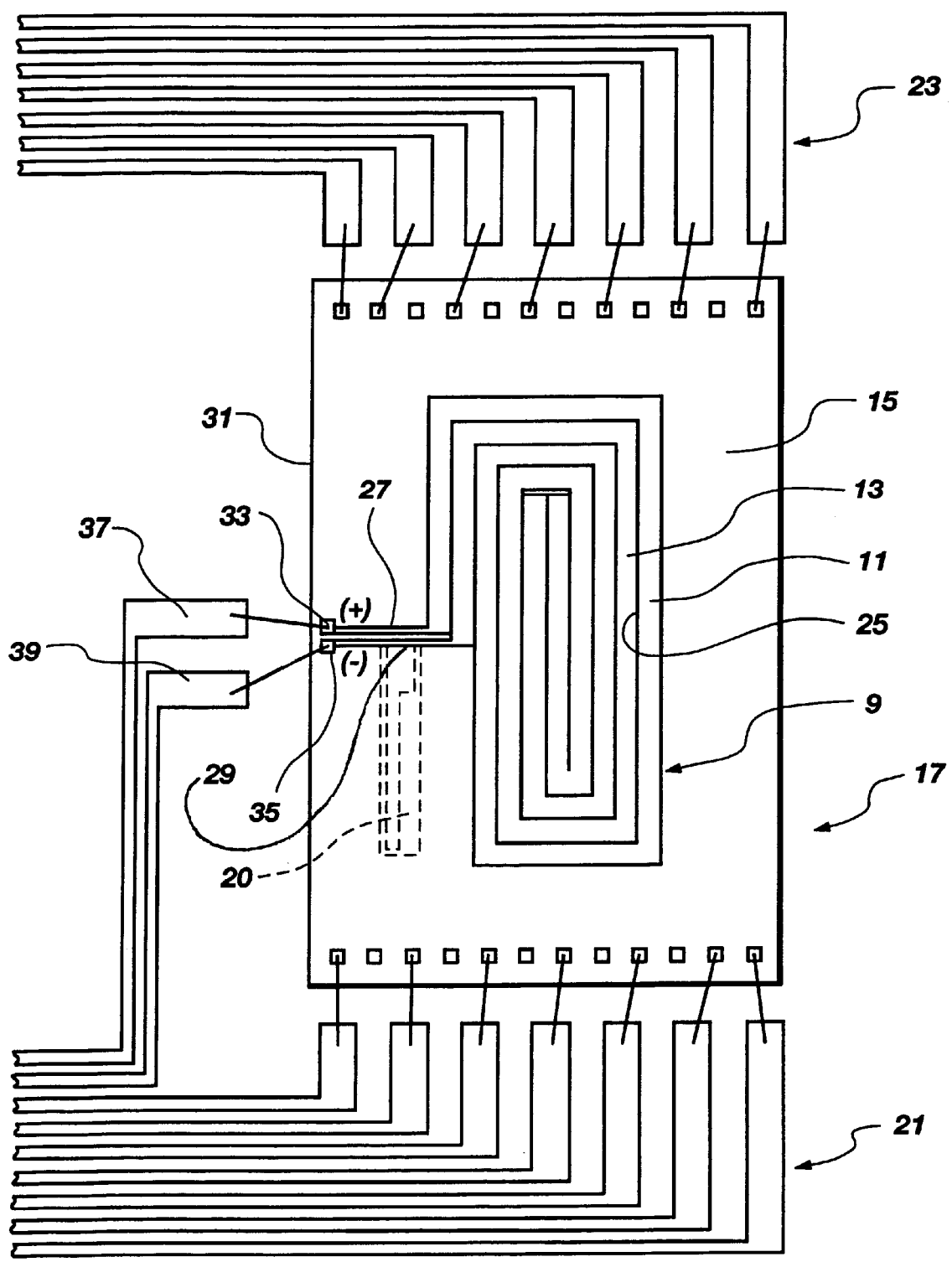
FIG. 1 is a top elevation of a die incorporating a first preferred embodiment of the invention.

The embodiment illustrated by FIG. 1 includes a capacitor 9 including positive 11 and negative 13 metallic electrode traces on the die-cap 15 of a die, generally 17. The die is illustrated in association with board circuit traces, generally 21, 23. The electrode traces 11, 13 are shown occupying a single layer in a nonlinear side-by-side serpentine spiral configuration, separated by a very thin dielectric deposit 25. Positive 27 and negative 29 leads extend to the edge 31 of the die 17, terminating in positive 33 and negative 35 terminals, respectively. The terminals 33, 35 are shown wire bonded to elements 37, 39 of the circuit trace 21 on a circuit board (not shown in full). As noted above, a resistor 20, shown in broken lines, may be fabricated simultaneously with electrode traces 11 and 13.

Figure 2:
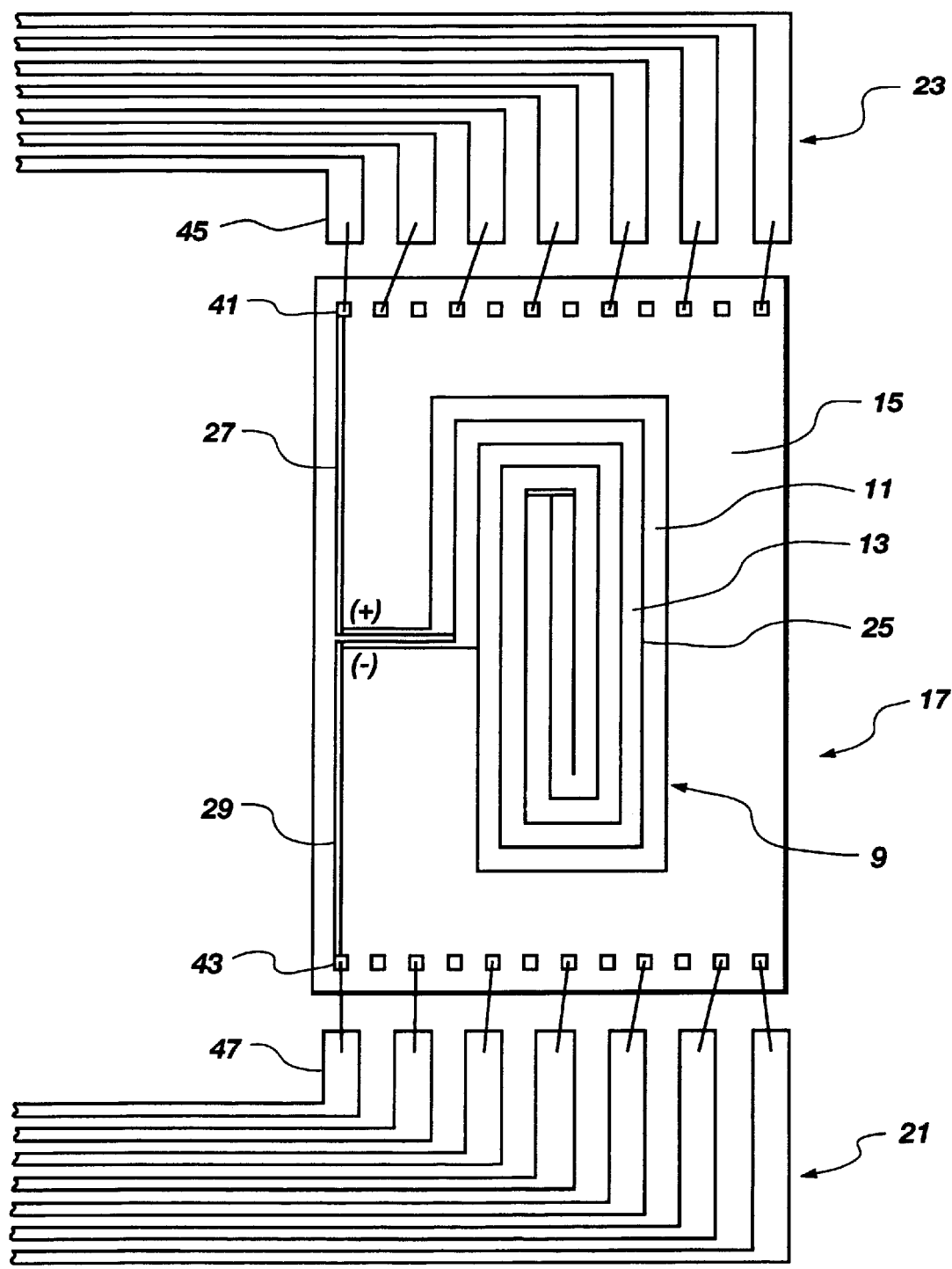
FIG. 2 is a top elevation of a die incorporating a second preferred embodiment of the invention.

Alternatively, as best shown by FIG. 2, the positive 27 and negative 29 leads of the capacitor 9 may be run within the die 17 to the power 41 and ground bond pads 43 of the die 17. These pads are connected in normal fashion to traces 45, 47, thereby eliminating the need for the two separate terminals 33, 35 and two wire bonded elements 37, 39, illustrated by FIG. 1.

Once the electrode traces 11, 13 are formed, the interelectrode dielectric deposit 25 may be provided incidental to application of a protective layer, such as spun-on polyimide, or by means of supplementary vapor deposition or other conventional techniques.

Figure 3:
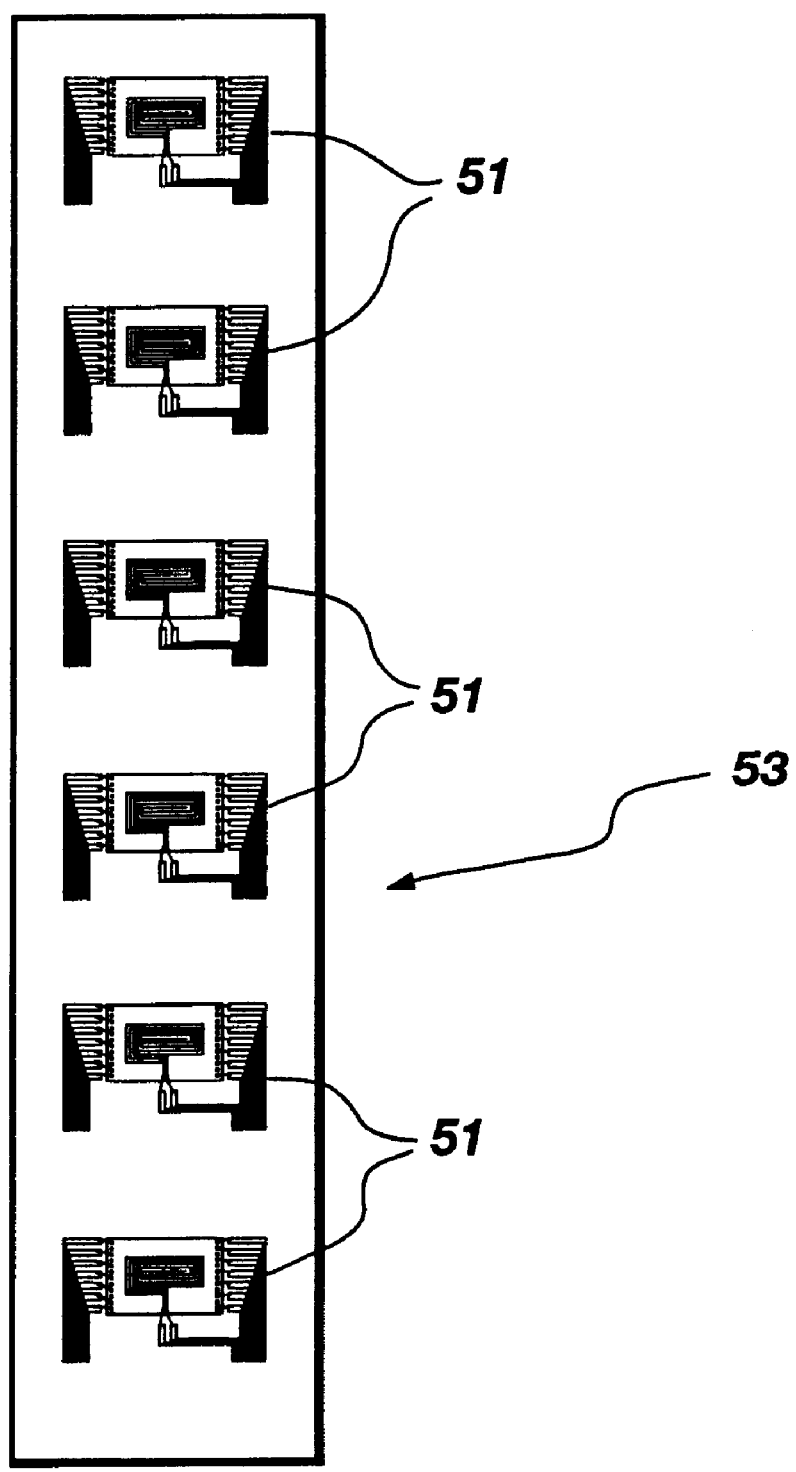
FIG. 3 illustrates a plurality of masks for forming the capacitor arrangement of FIG. 1.

A plurality of masks 51 suitable to fabricate die-top capacitors in accordance with this invention and, specifically in the configuration of FIG. 1, is illustrated in FIG. 3 on a transparent carrier substrate 53.

Figure 4:
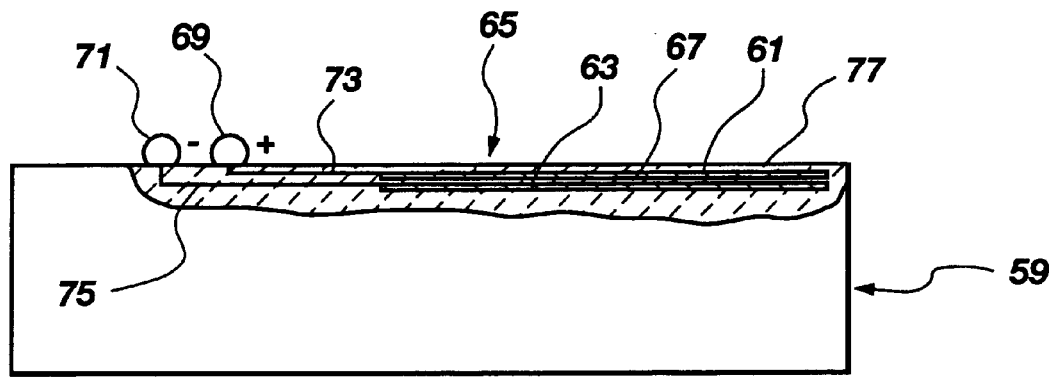
FIG. 4 is a side schematic partial section of a third preferred embodiment of the invention.

FIG. 4 illustrates a die 59 having positive electrode trace 61 and negative electrode trace 63 of capacitor 65 separated by a dielectric layer 67 in a dual-layer, or stacked, capacitor configuration in accordance with the present invention. The electrodes as well as the dielectric have been greatly exaggerated in thickness for clarity. It is also noteworthy that die 59 is configured for flip-chip bonding (such as Controlled Collapse Chip Connection (C4), a bonding technique introduced by International Business Machines Corporation and further developed by a variety of companies) with bumped bond pads 69 and 71 to which conductors 73 and 75 respectively extend from electrode traces 61 and 63. The other bumps acting as conductors for the remainder of the components on die 59 have been omitted for clarity. Passivation layer 77 is shown disposed over capacitor 65.

Figure 5:
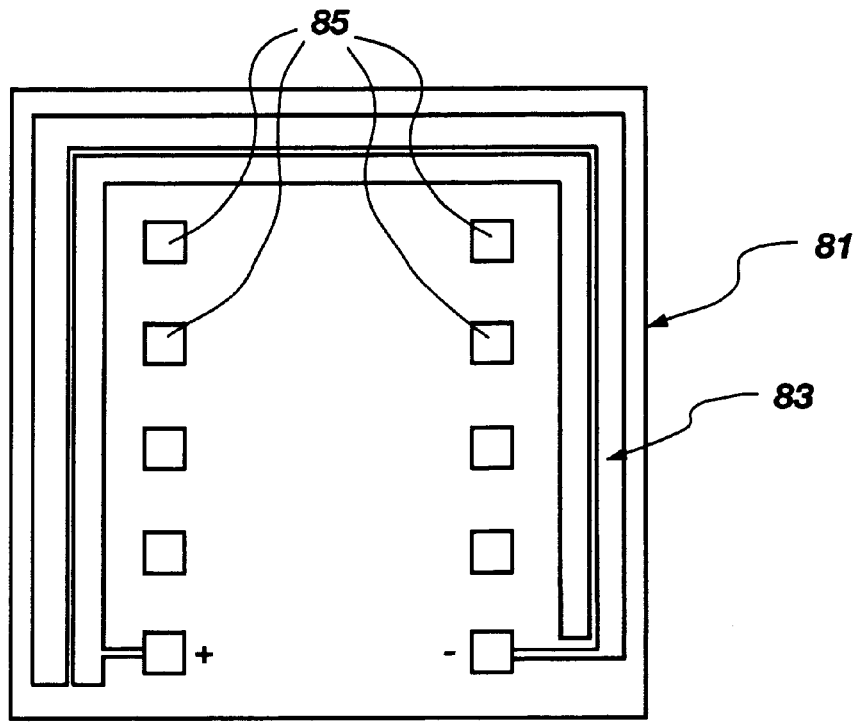
FIG. 5 is a top elevation of a die with a fourth preferred embodiment of the invention.

FIG. 5 illustrates a die 81 with a capacitor 83 formed in a nonlinear, U-configuration extending around a pattern of bond pads 85 for bonding of die 81 to a circuit board or other conductor-carrying platform. Capacitor 83 may be either of single-(shown) or double-layer configuration. A passivation layer through which bond pads are contacted has been omitted for clarity.

Thus, it will be apparent to those of ordinary skill in the art that the present invention affords varied and significant advantages over the prior art practice of employed discrete, separately-mounted capacitors with associated dies in C.O.B. applications. For example, the cost of the separate capacitor and its assembly to the board are eliminated, as well as the assembly time, resulting in a shorter cycle time for the end product. Substantial savings in board real estate are realized, offering the option of attaching more memory for a given board size, or shrinking the board size for a given memory capacity. Performance of the memory associated with the die-mounted gateway capacitor is optimized, as die-to-capacitor traces of the prior art are eliminated and the gateway capacitor acts as a final barrier between the die and the board, filtering out noise which would otherwise be "seen" by the devices on the die. Finally, no additional fabrication costs for the die are incurred if a suitable fabrication process segment, such as bumping, already included in fabrication is modified to add the capacitor structure.

Reference in this disclosure to certain details of the illustrated embodiments is not intended to restrict the scope of the appended claims, which themselves recite those features regarded as significant to the invention.

What is claimed is:

1. A capacitor for use with a semiconductor die, comprising:
   first and second elongated, substantially unbranched, nonlinear, planar electrodes formed as an integral portion of said semiconductor die, said electrodes formed of a metal the same as that of at least one other component disposed on an active surface of said semiconductor die, said active surface having a plurality of bumped bond pads disposed thereon, said electrodes located adjacent said active surface in an area peripheral to each of said plurality bumped bond pads;
   said electrodes occupying a common plane in substantially mutually coextensive side-by-side relationship with edges of said first electrode spaced from adjacent edges of said second electrode to define an elongated, continuous space therebetween; and
   a dielectric within said elongated, continuous space.

2. A capacitor according to claim 1, wherein said dielectric comprises a die coat covering an outer surface of said semiconductor die.

3. A capacitor according to claim 2, wherein said die coat comprises an organic die coat.

4. A capacitor according to claim 1, wherein said dielectric comprises a layer within said semiconductor die.

5. A capacitor according to claim 1, including first and second leads extending respectively from said first and second electrodes and connecting respectively to positive and negative bond pads accessible from an exterior of said semiconductor die.

6. A capacitor according to claim 5, wherein said positive and negative bond pads are positioned at an edge of said semiconductor die.

7. A capacitor according to claim 5, wherein said positive and negative bond pads are located remote from a perimeter of said semiconductor die.

8. A capacitor according to claim 1, further including a passivation layer covering said electrodes and said dielectric.

9. A semiconductor die, including:
   a plurality of active devices within an active surface of said semiconductor die;
   a plurality of bumped bond pads disposed on said active surface;
   a plurality of conductors extending to said plurality of bumped bond pads; and
   a decoupling capacitor comprising first and second elongated, substantially unbranched, nonlinear, mutually adjacent electrodes formed as an integral part of at least a portion of said active surface of said semiconductor die and in electrical communication with at least one active device of said plurality of active devices internally to said semiconductor die, said electrodes located in an area peripheral to each of said plurality of bumped bond pads, said decoupling capacitor configured to extend around said plurality of active devices, said plurality of conductors and said plurality of bond pads to occupy otherwise unoccupied real estate on said active surface.

10. The semiconductor die of claim 9, wherein said decoupling capacitor is located in a single plane and said first and second electrodes are laterally adjacent and separated by a dielectric.

11. The semiconductor die of claim 9, wherein said decoupling capacitor comprises two, parallel, planar electrodes superimposed on adjacent planes.

12. The semiconductor die of claim 9, wherein said decoupling capacitor is of serpentine configuration.

13. The semiconductor die of claim 9, wherein said at least one active device comprises a plurality of active devices, wherein said semiconductor die further includes a plurality of conductors extending to bond pads on a surface of said semiconductor die, and wherein said decoupling capacitor is configured to extend around said active devices, said conductors and said bond pads to occupy otherwise unoccupied real estate on said semiconductor die.

14. The semiconductor die of claim 9, wherein said decoupling capacitor is located under a passivation layer on a surface of said semiconductor die.

15. The semiconductor die of claim 9, wherein at least a portion of said decoupling capacitor is located within said semiconductor die and remote from a surface of said semiconductor die.

16. The semiconductor die of claim 9, further including a resistor on said semiconductor die electrically connected to said decoupling capacitor.

17. A semiconductor die, comprising:

at least one active surface with a plurality of bumped bond pads thereon, at least some of the plurality of bumped bond pads located inside a peripheral area of said semiconductor die;

first and second elongated, substantially unbranched, nonlinear, planar electrodes formed integrally with said semiconductor die and located adjacent said at least one active surface of said semiconductor die, said electrodes located in an area peripheral to each of said plurality bumped bond pads, said electrodes formed of a same metal as said bond pads of said plurality of bumped bond pads;

said electrodes occupying a common plane in substantially mutually coextensive side-by-side relationship with edges of said first electrode spaced from adjacent edges of said second electrode to define an elongated, continuous space therebetween; and a dielectric within said elongated, continuous space.

18. The semiconductor die of claim 17, wherein said electrodes are configured to surround at least some of said plurality of bumped bond pads.

19. The semiconductor die of claim 17, wherein said electrodes horizontally extend in-between at least two of said plurality of bumped bond pads.

* * * * *

UNITED STATES PATENT AND TRADEMARK OFFICE
CERTIFICATE OF CORRECTION

PATENT NO. : 6,285,070 B1  Page 1 of 1
APPLICATION NO. : 09/298159
DATED : September 4, 2001
INVENTOR(S) : David J. Corisis and Jerry M. Brooks It is certified that error appears in the above-identified patent and that said Letters Patent is hereby corrected as shown below:

On the title page:
In the FOREIGN PATENT
  DOCUMENTS, LINE 2,                change "4-127161A" to --4-127461A--

In the specification:
    COLUMN 5,    LINE 3,    change "power 41" to --power bond pads 41--
    COLUMN 5,    LINE 41,   change "employed" to --employing--

In the claims:
CLAIM 13,  COLUMN 6,  LINE 65,
  through     COLUMN 7,  LINE 5,    delete text of existing Claim 13 in its entirety and insert in its place --13. The semiconductor die of Claim 9, wherein said serpentine configuration substantially comprises a spiral.--

Signed and Sealed this

Tenth Day of October, 2006

JON W. DUDAS
*Director of the United States Patent and Trademark Office*